(12) United States Patent
Chang et al.

(10) Patent No.: US 6,643,841 B2
(45) Date of Patent: Nov. 4, 2003

(54) TAPE-OUT SYSTEM OF MASK TOOLING NETWORK FOR MULTIPLE SUPPLY CHAIN

(75) Inventors: Chin-Hai Chang, San-Wan Hsiang (TW); Teh-Sen Perng, Chu-Tung Chen (TW)

(73) Assignee: United Microelectronics Corp., Hsinchu (TW)

( * ) Notice: Subject to any disclaimer, the term of this patent is extended or adjusted under 35 U.S.C. 154(b) by 104 days.

(21) Appl. No.: 09/956,513

(22) Filed: Sep. 19, 2001

(65) Prior Publication Data

US 2003/0056188 A1 Mar. 20, 2003

(51) Int. Cl.[7] .............................................. G06F 17/50
(52) U.S. Cl. ............................ 716/19; 716/20; 716/21
(58) Field of Search ............................ 716/19, 20, 21, 716/4, 3, 5, 6, 8; 700/121, 111, 123, 122

(56) References Cited

U.S. PATENT DOCUMENTS

| | | | | |
|---|---|---|---|---|
| 5,943,488 A | * | 8/1999 | Raza | 716/19 |
| 6,330,708 B1 | * | 12/2001 | Parker et al. | 716/19 |
| 6,347,258 B1 | * | 2/2002 | Hsu et al. | 700/121 |
| 6,351,684 B1 | * | 2/2002 | Shirley et al. | 700/121 |
| 6,470,489 B1 | * | 10/2002 | Chang et al. | 716/21 |

* cited by examiner

Primary Examiner—Matthew Smith
Assistant Examiner—Binh C. Tat
(74) Attorney, Agent, or Firm—Charles C.H. Wu; Wu & Cheung, LLP (57) ABSTRACT

A tape-out system of a mask tooling network for multiple supply chain. The tape-out system includes an integrated circuit (IC) designer computer, a design service computer, and a mask house computer; wherein the IC designer computer, the design service computer and the mask house computer are the multi-users for the tape-out system. A network connects the IC designer computer, the design service computer and the mask house computer. A device design data and a product mask data are provided through the network from the IC designer computer to the design service computer. The device design data and the product mask data undergo a processing step and a summarizing step, so that a product mask tooling data is obtained, which is then transmitted through the network to the mark house computer and the IC designer computer. The mask house computer fabricates a mask in accordance with the product mask tooling data.

20 Claims, 6 Drawing Sheets

TAPE-OUT SYSTEM OF MASK TOOLING NETWORK FOR MULTIPLE SUPPLY CHAIN

BACKGROUND OF THE INVENTION

1. Field of Invention

The present invention relates to a network tape-out system. More particularly, the present invention relates to a tape-out system of a mask tooling network for multiple supply chain.

2. Description of the Related Art

Designers of an integrated circuit (IC) use a conventional method to obtain a required mask, and they first hand over the device design data to the design service agents. The design service agents will start to design according to the device design data provided. Then the device design data that has been processed is passed to various mask suppliers to fabricate masks according to various requirements.

From the design service to the mask fabrication, the tape-out data of the conventional method that is used by the IC design agents is all transmitted and exchanged by oral information, paper data, fax data or e-mail attached files, etc. Therefore, mask data has to be inputted multiple times by hand and printed out, and there are no safety codes or signatures, etc. to protect the data during the transmission process. Moreover, the design agents are restricted to the local working hours to search and inquire about information. The manual method of processing the data exchange cannot perform automatic mask design for multiple devices. When performing multi-transmissions of various data, the conventional method cannot combine the design pattern and the mask layer into a comparison list.

SUMMARY OF THE INVENTION

It is an object of the present invention to provide a tape-out system of a mask tooling network for multi-users to improve the conventional manual method of processing the exchange data which has no safety or security protection.

It is another object of the present invention to provide a tape-out system of a mask tooling network for multi-users to resolve the problem of the conventional method that cannot combine the design pattern and the mask layers into a comparison list.

The present invention provides a tape-out system of a mask tooling network for multi-users, wherein the system comprises: an integrated circuit (IC) designer computer; a design service computer; and a mask house computer, wherein the IC designer computer, the design service computer and the mask house computer are linked by a network. A mask tooling of a product is requested by the IC designer computer, and a data of the mask tooling is transmitted to the design service computer. The mask tooling data undergoes a processing step and a summarizing step with an electronic signature carried out by the design service computer. A signal from the design service computer is transmitted to notify the mask house computer and the IC designer computer to process and summarize the mask tooling data. A signal of the electronic signature is transmitted to the design service computer after the mask house computer and the IC designer computer process the mask tooling data.

The IC designer computer, design service computer and the mask house computer of the present invention are linked together so that the mask tooling process is transmitted by a network method. Since the whole process is computerized, a manual method can be avoided to prevent errors such as missing data or incomplete data. The present invention utilizes an electronic signature as a safety procedure during the data exchanging process, so that the designer data can be protected.

Since the IC designer computer, design service computer and the mask house computer are linked together by the network, the system is not limited to local working hours. Users can connect to the network and search for any related information at any time without being restricted to working hours. The whole transmission process is computerized; therefore, mask tooling of multiple devices can be completed automatically.

The present invention provides for multi-transmission of various data by computers and a network; therefore, the design pattern and the mask layers can be combined to form a comparison list.

Both the foregoing general description and the following detailed description are exemplary and explanatory only and are not restrictive of the invention, as claimed.

BRIEF DESCRIPTION OF THE DRAWINGS

The accompanying drawings are included to provide a further understanding of the present invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
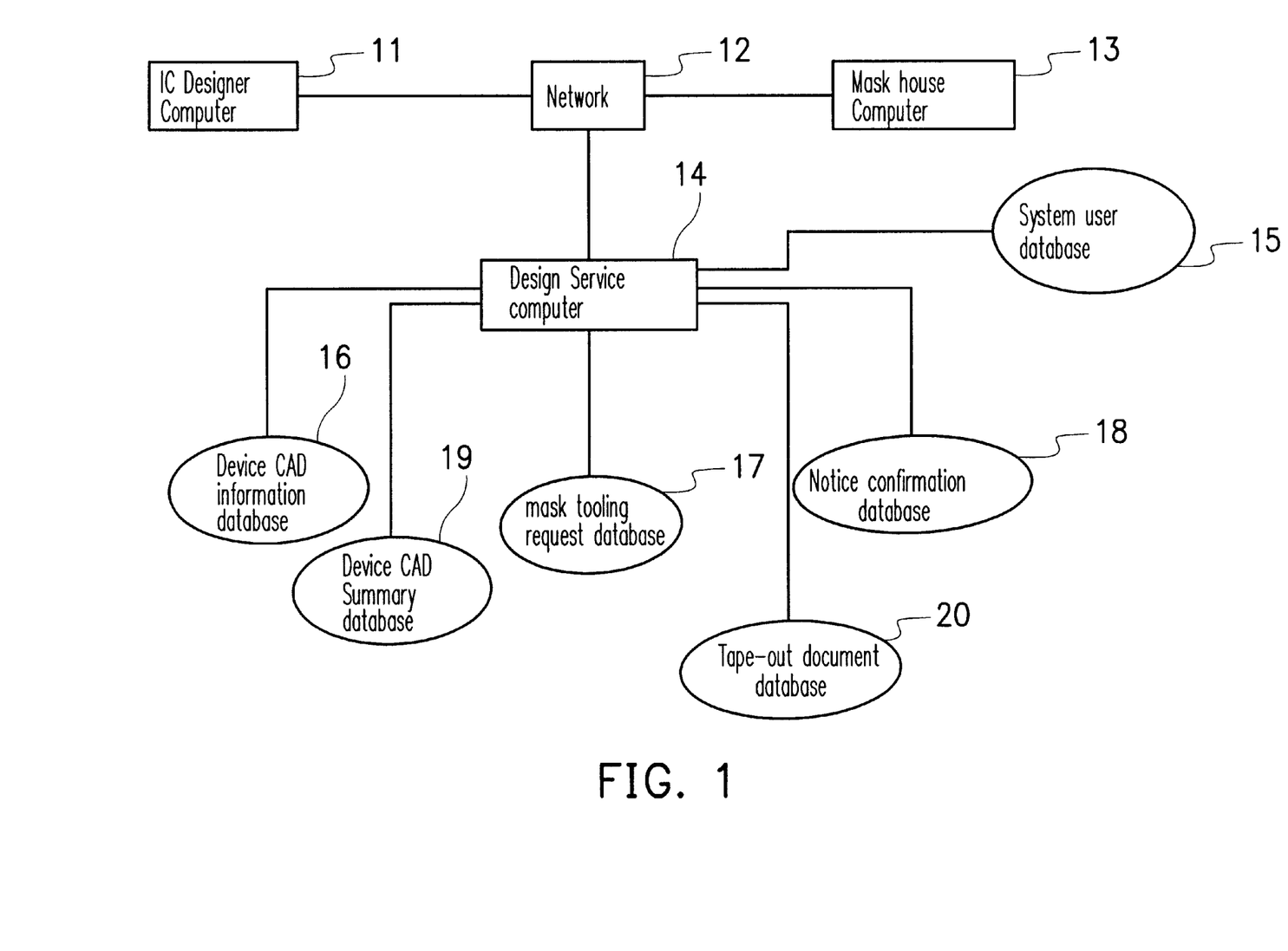
FIG. 1 is a flow chart of a tape-out system fabricated by a mask tooling network of multi-supplying links in accordance with a preferred embodiment of the present invention.

FIG. 1 illustrates a flow chart of a tape-out system fabricated by a mask tooling network of multi-supplying links in accordance with a preferred embodiment of the present invention.

Referring to FIG. 1, a system consists of an integrated circuit (IC) design computer 11, a mask house computer 13 and a design service computer 14. The design service computer 14 is connected to the IC design computer 11 and the mask house computer 13 by a network 12.

The design service computer 14 determines the storing cognizance of the IC design computer 11 and the mask house computer 13 in accordance with data obtained from a system user database 15. For example, the system user database 15 gives a command that only allows a user to read a file, or a command that allows the user to correct or edit the file.

When the IC design computer 11 provides device design data, such as device design attributions and product mask data, to the design service computer 14, the design service computer 14 carries out a process comprising debugging, file converting and electronic signature steps etc. to the provided data. The device design data and the product mask data are then stored respectively in a device computer aided design (CAD) information database 16 and a mask tooling request database 17. The design service computer 14 proceeds with a data summary process to the multi-transmitted design data of the device from the IC design computer 11. After the data summary process, the design data of the device is stored in a device CAD summary database 19.

Data from the device CAD information database 16, the mask tooling request database 17 and the device CAD summary database 19 are transmitted to the IC design computer 11 by the design service computer 14, and this data is converted into product data of mask tooling in accordance with the requirements from the IC design computer 11.

The design service computer 14 stores the product data of mask tooling in a tape-out document database 20, and produces an electronic signature to inform a notice confirmation database 18. The design service computer 14 will transmit a signal to notify the mask house computer 13 and the IC design computer 11 for retrieving mask tooling data of the product from the tape-out document database 20. The design service computer 14 also informs the notice confirmation database 18 to proceed with the electronic signature step. The mask house computer 13 will fabricate a mask according to the product mask tooling data.

Figure 2:
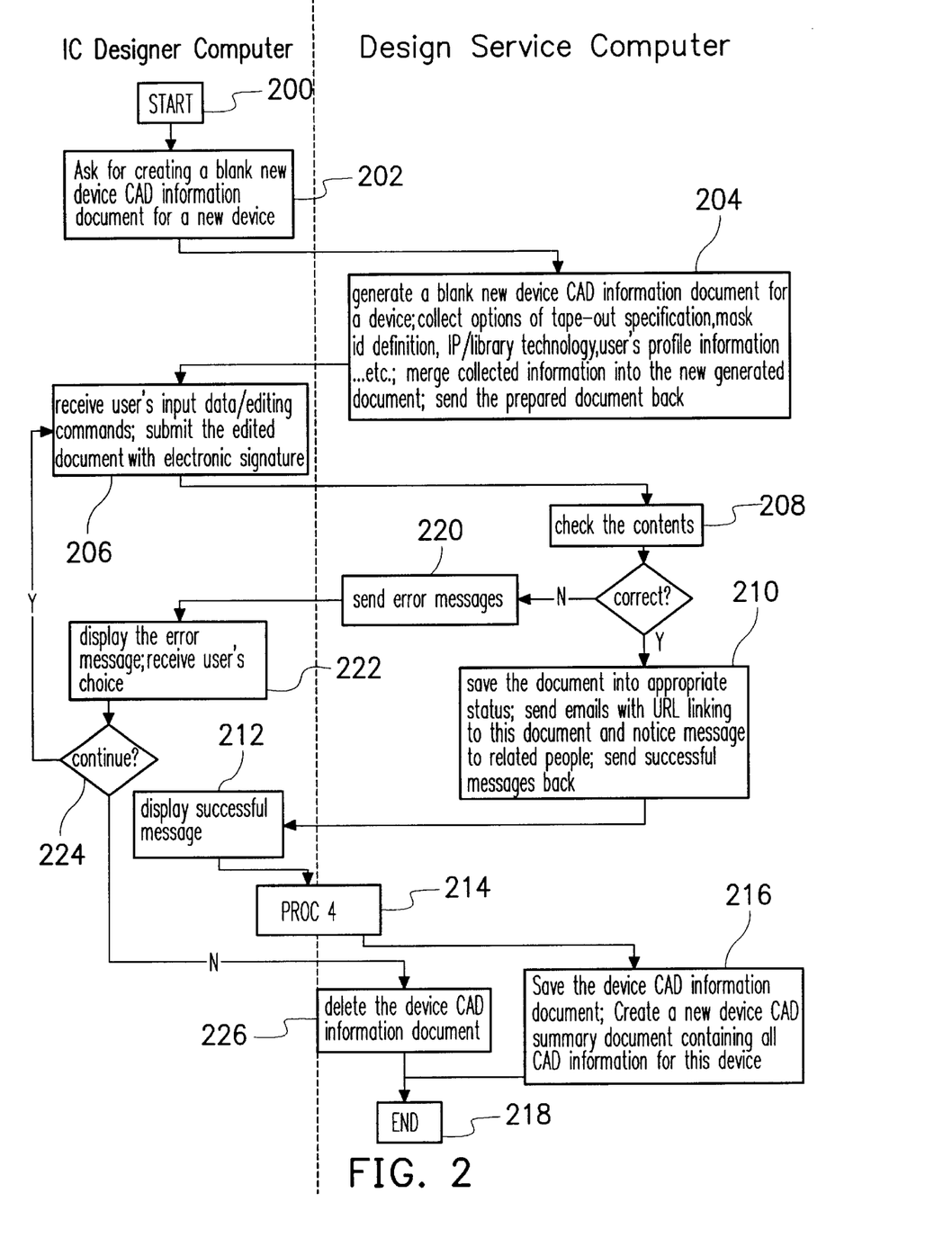
FIG. 2 is a flow chart of procedure 1 (PROC 1), sending CAD information for a new device in accordance with a preferred embodiment of the present invention.

FIG. 2 illustrates a flow chart of procedure 1 (PROC 1) sending CAD information for a new device in accordance with a preferred embodiment of the present invention.

Referring to FIG. 2, the IC designer computer first starts (step 200) to request for creating a blank new device CAD information document for a new device (step 202), and notifies the design service computer. The design service computer starts to generate a blank new device CAD information document for a device and collect data, such as options of a tape-out specification and a user's profile information, into a new generated document. The generated document is sent out to the IC designer computer (step 204). The IC designer computer will then receive an input data and an editing command from the user, in which an electronic signature is submitted from the IC designer computer (step 206) to verify the content of the generated document that has been edited (step 208).

If the IC design computer verifies that the content of an edited document is correct, the edited document is then stored, and the edited document is linked to an Universal Resource Location (URL). E-mails with the URL linking to the document and a notice message are sent to related people, and a successful message is transmitted out (step 210). The IC designer computer displays the successful message (step 212). A procedure 4 (PROC 4) is then performed (step 214) to save the device CAD information document in the IC designer computer and create a new device CAD summary document containing all CAD information for the device (step 216). Once all these steps are completed, the process then ends (step 218).

However, if the IC designer computer verifies that the content of an edited document is incorrect (step 208), the IC designer computer will send out an error message (step 220). The IC designer computer displays the error message and receives a choice from a user (step 222). The IC designer computer will then decide whether or not to continue the transmission process of the device CAD information document (step 224). If the transmission process continues, the process has to return to step 206. Otherwise, the process will delete the device CAD information document (step 226), which will be omitted, and the process will end (step 218).

Figure 3:
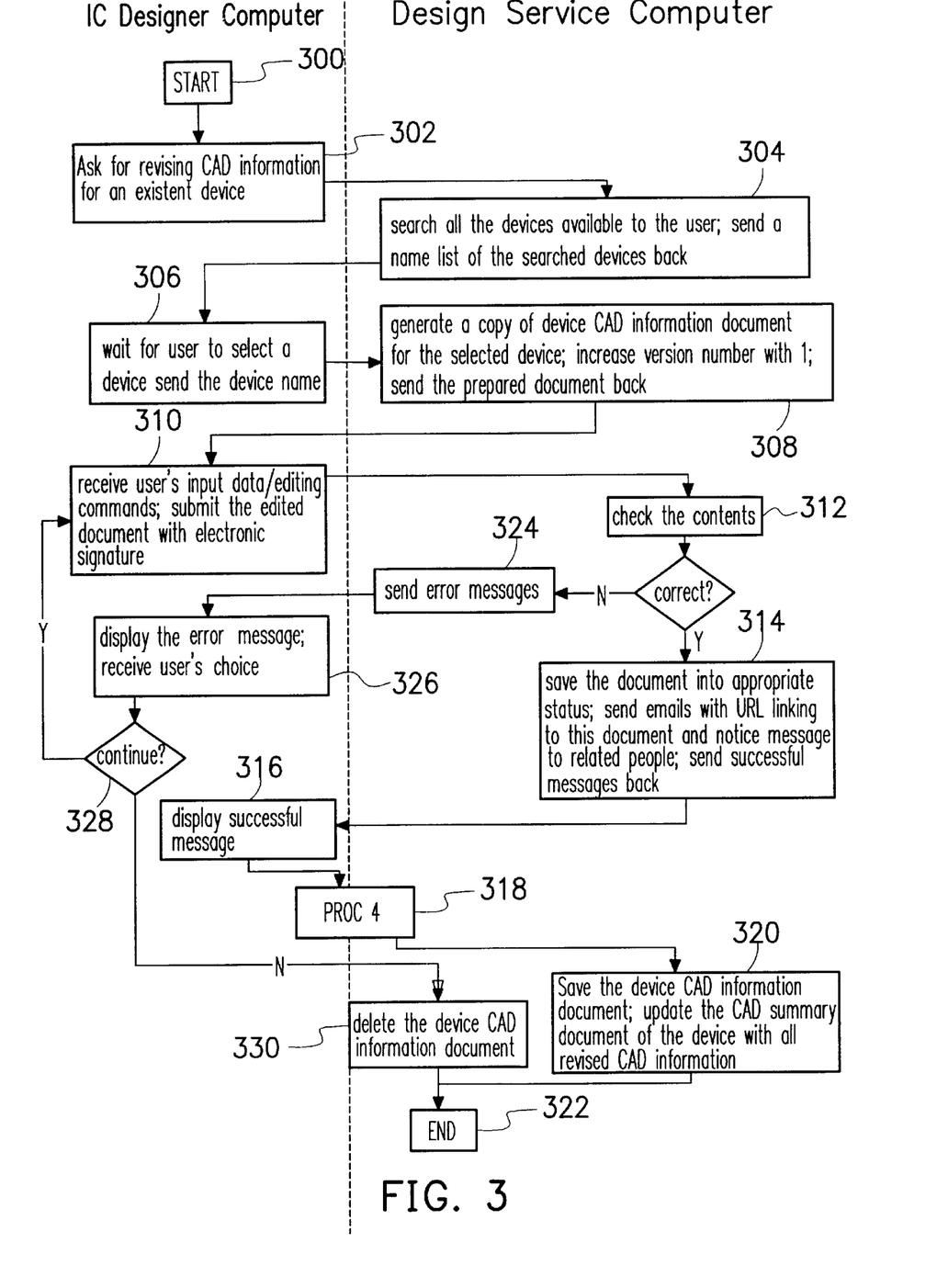
FIG. 3 is a flow chart of procedure 2 (PROC 2), sending revised CAD information for an existing device in accordance with a preferred embodiment of the present invention.

FIG. 3 illustrates a flow chart of PROC 2 sending revised CAD information for an existing device in accordance with a preferred embodiment of the present invention.

Referring to FIG. 3, the IC designer computer starts (step 300) to request for revising the device CAD information document (step 302), and notifies the design service computer. The design service computer searches a list containing all the devices that are available to the user, and then transmits the list to notify the IC design computer (step 304). The IC design computer will be given a command from the user to select devices from the list and to send a name of the selected device to the design service computer (step 306). The design service computer generates a copy of the device CAD information document for the selected device, and sends the copy of the device CAD information document of the selected device to the IC designer computer (step 308). Once the IC designer computer receives input data and editing commands from the user, the IC designer computer submits the edited document with an electronic signature (step 310) and notifies the design service computer, which will verify the content of the edited document (step 312).

If the design service computer verifies that the content of the edited document is correct (step 312), the edited document is then stored and is linked to an Universal Resource Location (URL). E-mails with the URL linking to the edited document and a notice message are sent to related people, and a successful message is transmitted out (step 314). The IC designer computer displays the successful message (step 316). A procedure 4 (PROC 4) is then performed (step 318) to save the device CAD information document in the design service computer and update a device CAD summary document containing all the revised CAD information (step 320). Once all these steps are completed, the process then ends (step 322).

However, if the design service computer verifies that the content of the edited document is incorrect (step 312), the IC designer computer will send out an error message (step 324). The IC designer computer displays the error message and receives a choice from a user (step 326). The IC designer computer will then decide whether or not to continue the transmission process of the device CAD information document(step 328). If the transmission process continues, the process has to return to step 310. Otherwise, the process will delete the device CAD information document (step 330), and the device CAD information document will be omitted and the process will end (step 322).

Figure 4:
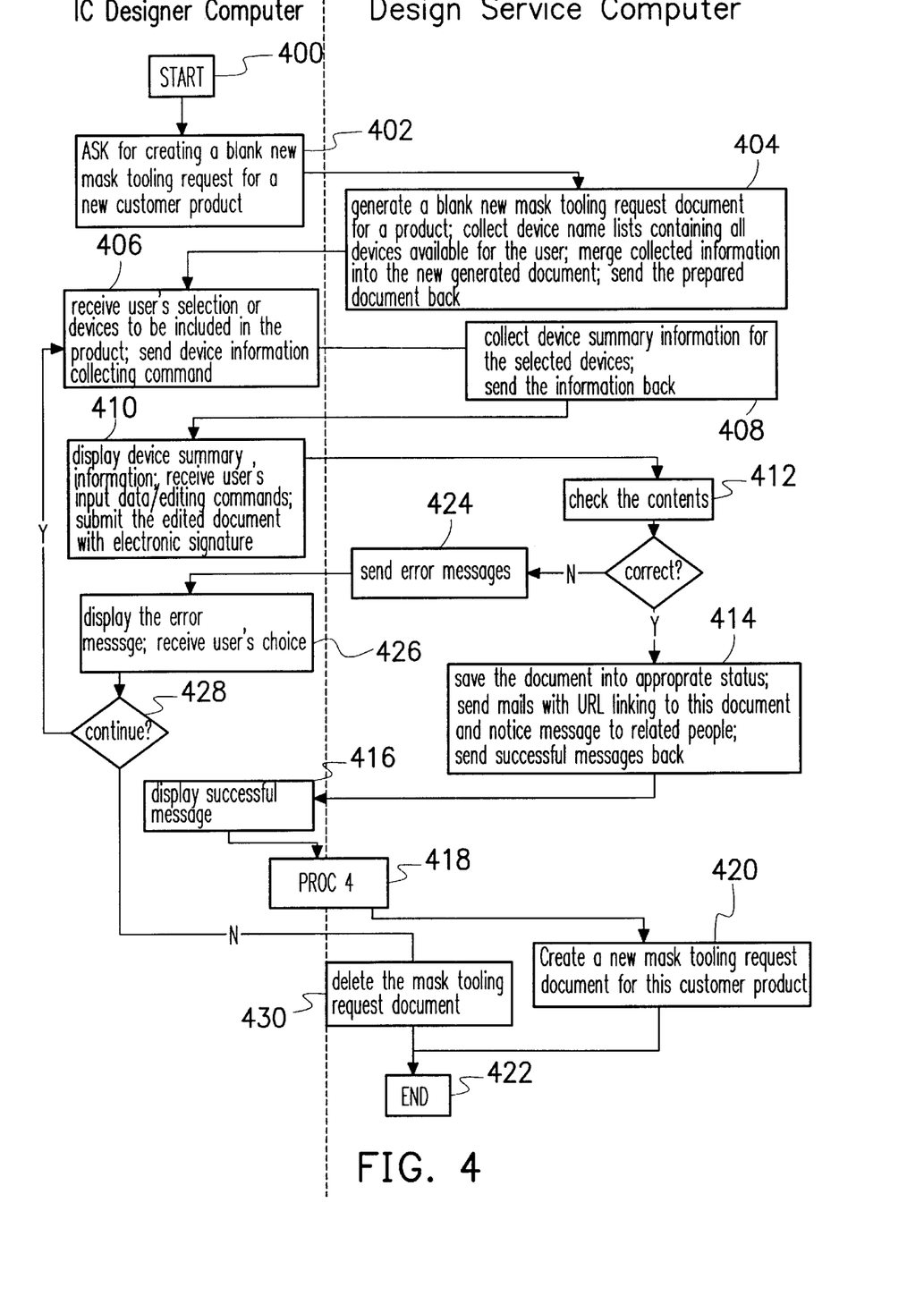
FIG. 4 is a flow chart of procedure 3 (PROC 3), sending a mask tooling request for a new product in accordance with a preferred embodiment of the present invention.

FIG. 4 illustrates a flow chart of PROC 3, sending a mask tooling request for a new product in accordance with a preferred embodiment of the present invention.

Referring to FIG. 4, the IC designer computer starts (step 400) to request for creating a blank new mask tooling request for a new customer product (step 402), and notifies the design service computerdesign service computer. The design service computerdesign service computer creates a blank new mask tooling request for a product, collects a list containing all the devices that are available to the user, combines all the information into a new generated document and then transmits the new generated document to the IC design computer (step 404). The IC designer computer will be given a command from the user to select devices from the list, and a device information collecting command of the selected device is sent out to the design service computer-design service computer (step 406). The design service computerdesign service computer collects device summary information for the selected device, and sends the device summary information of the selected device to the IC designer computer (step 408). The IC designer computer displays the device summary information of the selected device. Once the IC designer computer receives input data and editing commands from the user, it submits the edited document with an electronic signature (step 410) and notifies the design service computerdesign service computer, which will verify the content of the edited document (step 412).

If the design service computerdesign service computer verifies that the content of the edited document is correct (step 412), the edited document is then stored and is linked to a URL. E-mails with the URL linking to the edited document and a notice message are sent to related people, and a successful message is transmitted out (step 414). The IC designer computer displays the successful message (step 416). The process enters a PROC 4 step (step 418). Afterwards, the design service computerdesign service computer will create a new mask tooling request document for this customer product (step 420). Once all these steps are completed, the process then ends (step 422).

However, if the design service computerdesign service computer verifies that the content of the edited document is incorrect (step 412), the IC designer computer will send out an error message (step 424). The IC designer computer displays the error message and receives a choice from the user (step 426). The IC designer computer will then decide whether or not to continue the transmission process of the mask tooling request document (step 428). If the transmission process continues, the process has to return to step 410. Otherwise, the process will delete the mask tooling request document (step 430), which will be omitted, and the transmission process will come to an end (step 422).

Figure 5:
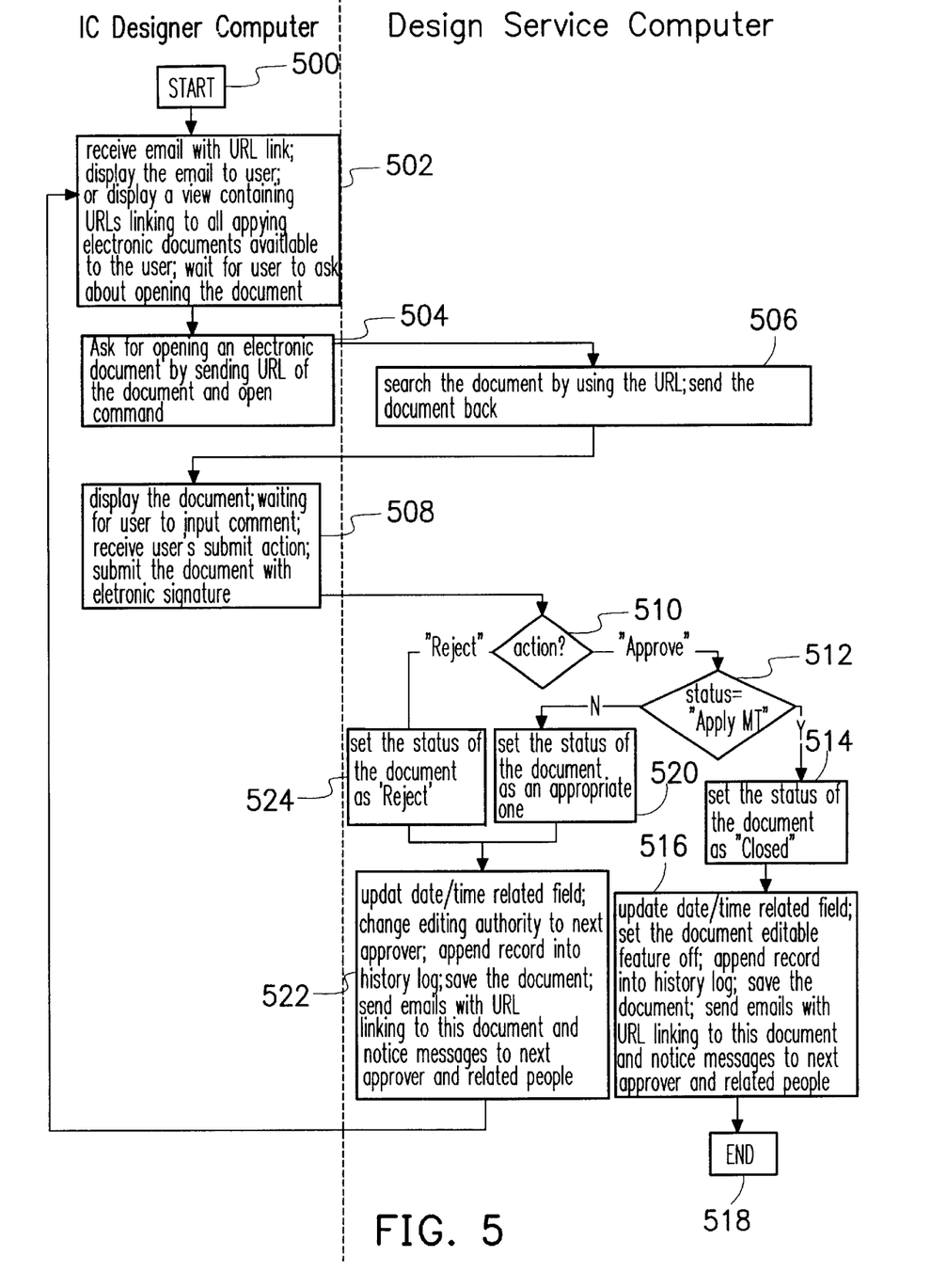
FIG. 5 is a flow chart of procedure 4 (PROC 4), which is an electronic approval cycle, in accordance with a preferred embodiment of the present invention.

FIG. 5 illustrates a flow chart of PROC 4, which is an electronic approval cycle, in accordance with a preferred embodiment of the present invention.

Referring to FIG. 5, the IC designer computer starts (step 500) to receive an e-mail with a URL link, display the received e-mail to the user and wait for a command from the user to open the e-mail (step 502). The IC designer computer requests to open an electronic document by sending the open command and the URL of the electronic document (step 504). The design service computerdesign service computer searches for the document by using the URL and sends the document to the IC designer computer (step 506). The design service computerdesign service computer displays the document and waits for an input command from the user. Once the IC designer computer receives the input command from the user, it submits the document with an electronic signature (step 508). The IC designer computer notifies the design service computerdesign service computer, which will verify whether the action made by the IC designer computer in step 508 is correct or not (step 510).

If the design service computerdesign service computer approves the action made by the IC designer computer (step 510), the design service computerdesign service computer will decide whether to request for mask tooling. If the design service computerdesign service computer requests for mask tooling, the design service computerdesign service computer will set a status of the document as 'closed' (step 514). Date and time of the related field of the document will be updated. A document editable feature is set to the 'off' status, and a new record will be appended into the history log. E-mails with URL linkings to the document are sent out to a next approver and related people, who are notified by a notified message (step 516). Once all these steps are completed, the process then ends (step 518).

However, if the design service computerdesign service computer does not request for mask tooling at step 512, the design service computerdesign service computer will set the document to an 'appropriate one' status (step 520). The date and time of the related field of the document will be updated, and an editing authority is changed to a next approver, A new record will be appended into the history log, and the e-mails linking the document to the URL are sent out to related people, who are notified with a notified message (step 522). The process will then go back to step 502.

However, if the design service computerdesign service computer verifies that the action made by the IC designer computer is incorrect (step 510), the design service computerdesign service computer will set the document to a 'reject' status (step 524). The process will then go back to step 502.

Figure 6:
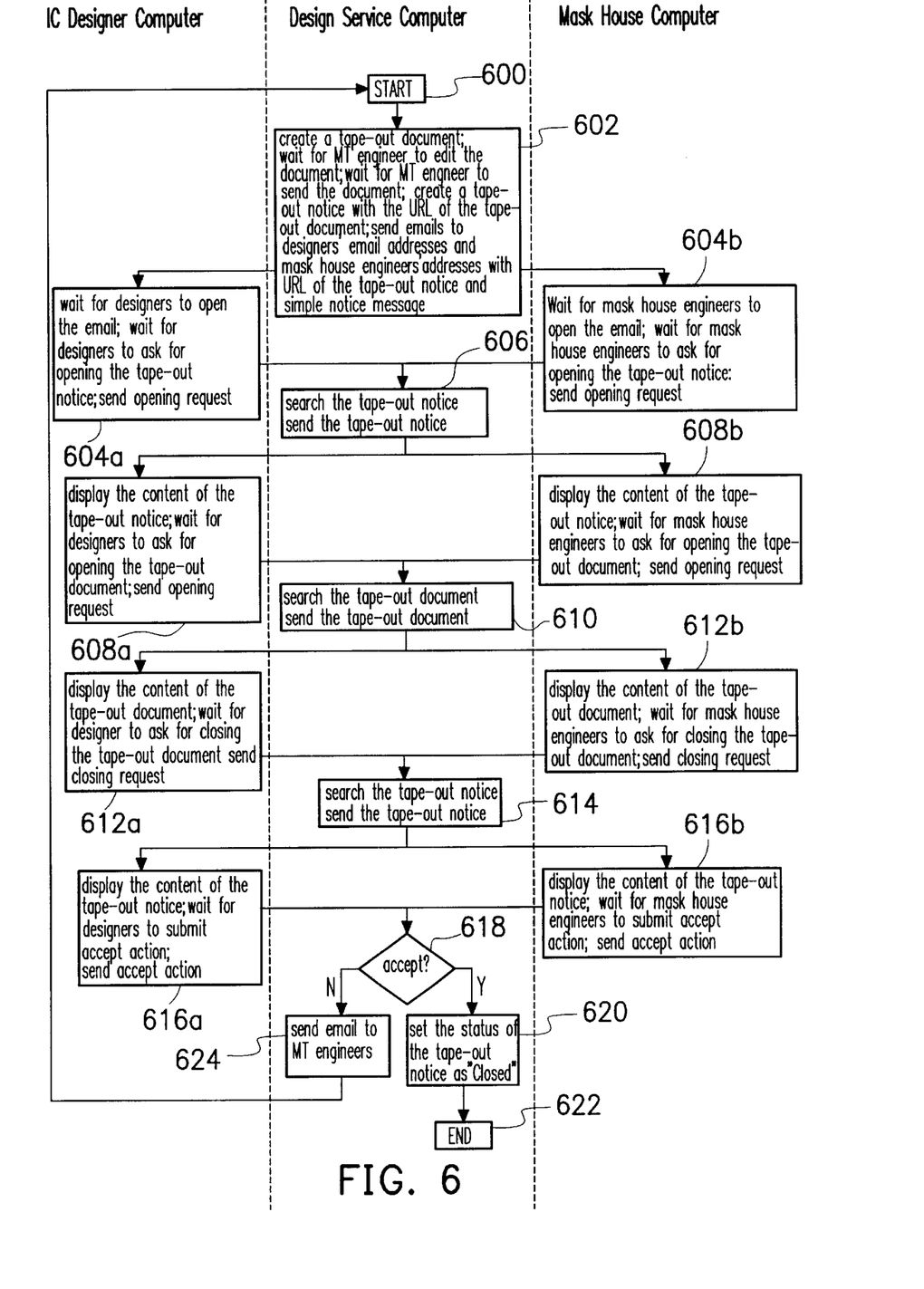
FIG. 6 is a flow chart of procedure 5 (PROC 5) sending tape-out information with electronic notice-confirming in accordance with a preferred embodiment of the present invention.

FIG. 6 illustrates a flow chart of PROC 5, sending tape-out information with electronic notice-confirming in accordance with a preferred embodiment of the present invention.

Referring to FIG. 6, the IC designer computer, the design service computerdesign service computer and the mask house computer utilize the e-mails to verify the transmission of the tape-out information. The design service computerdesign service computer starts (step 600) to create a tape-out document and then wait for a mask tooling engineer to edit the document. The document is sent out by the mask tooling engineer, and a tape-out notice about the tape-out document with the URL is created. An e-mail with the URL is sent out to the IC designer computer and the mask house computer (step 602). The IC designer computer waits for commands from designers to open the e-mail and the tape-out notice. An opening request is sent out to the design service computerdesign service computer (step 604*a*). At the same time, the mask house computer waits for commands from mask house engineers to open the e-mail and the tape-out notice. An opening request is sent out to the design service computerdesign service computer (step 604*b*).

The design service computerdesign service computer searches the tape-out notice and sends the tape-out notice to the IC designer computer and the mask house computer (step 606).

The IC designer computer displays the contents of the tape-out notice, waits for a command from the designers to request for opening the tape-out document. and sends out an opening request (step 608*a*) to the design service computerdesign service computer. At the same time, the mask house computer displays the contents of the tape-out notice, waits for a command from the mask house designers to request for opening the tape-out document and sends out an opening request (step 608*b*) to the design service computerdesign service computer.

The design service computerdesign service computer searches the tape-out document and sends the tape-out document to the IC designer computer and the mask house computer (step 610).

The IC designer computer displays the content of the tape-out document, waits for a command from the designers to request for closing the tape-out document and sends out a 'closing request' command to the design service computer (step 612*a*). At the same time, the mask house computer displays the contents of the tape-out notice, waits for a command from the mask house designers to request for closing the tape-out document and sends out an closing request (step 612b) to the design service computer.

The design service computer searches the tape-out notice and sends the tape-out notice to the IC designer computer and the mask house computer (step 614).

The IC designer computer displays the contents of the tape-out notice, waits for a submission from the designers to approve the action and sends out an 'accept action' command to the design service computer (step 616a). At the same time, the mask house computer displays the contents of the tape-out notice, waits for a submission from the mask house designers to approve the action and sends out an 'accept action' command (step 616b) to the design service computer.

The design service computer will verify the action requested from the IC designer computer and the mask house computer, and the design service computer will determine whether or not to accept the action (step 618). If the design service computer accepts the action that is requested from the IC designer computer and the mask house computer, the design service computer will set the status of the tape-out notice to 'closed' (step 620). After completing step 620, the process will finally come to an end (step 622). However, if the design service computer denies the action that is requested from the IC designer computer and the mask house computer, an e-mail is sent out to the mask house engineers by the design service computer to notify them that there is an error in the process. The process will need to go back to step 600 to re-start.

From the above-described embodiment, the IC designer computer, design service computer and the mask house computer are linked together by a network in order to complete the transmission process of the tape-out operation of the mask tooling. Each step of the transmission process utilizes the electronic signature method to secure and protect the tape-out document. The network provides an effective system that can transmit and exchange data, combine the multi-transmitted design pattern and the mask layer into a comparison list, and complete the tape-out operation of the mask tooling accurately and rapidly.

The advantages of the present invention are as follows:
1. The IC designer computer, design service computer and the mask house computer are linked together, so that the mask tooling process is transmitted by a network method. Since the whole process is computerized, a manual method can be avoided to prevent errors such as missing data or incomplete data.
2. The present invention utilizes an electronic signature as a safety procedure during the data exchanging process, so that the designer data can be protected.
3. Since the IC designer computer, design service computer and the mask house computer are linked together by the network, the system is not limited to local working hours. Users can connect to the network and search for any related information at any time without being restricted to working hours.
4. The whole transmission process is computerized; therefore, multiple devices of mask tooling can be completed automatically.
5. The present invention utilizes computers and a network to carry out the transmission Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A tape-out system of a mask tooling network for multiple supply chain, the tape-out system comprising:
    an integrated circuit (IC) designer computer;
    a design service computer;
    a mask house computer, wherein the IC designer computer, the design service computer and the mask house computer are the multi-users for the tape-out system; and
    a network connected to the IC designer computer, the designer service and the mask house computer, wherein a device design data and a product mask data are provided through the network from the IC designer computer to the design service computer, wherein the device design data and the product mask data undergo a processing step and a summarizing step so that a product mask tooling data is obtained, which is then transmitted through the network to the mask house computer and the IC designer computer, wherein the mask house computer fabricates a mask in accordance with the product mask tooling data.

2. The tape-out system of claim 1, wherein the tape-out system further comprises a system user database, and the design service computer determines a storing cognizance of the IC designer computer and the mask house computer in accordance with data obtained from a system user database.

3. The tape-out system of claim 1, wherein the tape-out system further comprises a device computer aided design (CAD) information database to store the device design data that is processed by the design service computer.

4. The tape-out system of claim 1, wherein the tape-out system further comprises a mask tooling request database to store the product mask data that is processed by the design service computer.

5. The tape-out system of claim 1, wherein the summarizing step of the design service computer consists of summarizing multi-transmitted device design data into a device summary data.

6. The tape-out system of claim 5, wherein the tape-out system further comprises a device CAD summary database for storing the device summary data of the design service computer.

7. The tape-out system of claim 1, wherein the tape-out system further comprises a tape-out document database for storing the mask tooling data of the design service computer.

8. The tape-out system of claim 7, wherein the tape-out system further comprises a notice confirmation database, which is notified by an electronic signature when the design service computer stores the product mask tooling data into the tape-out document database.

9. The tape-out system of claim 1, wherein the processing step of the design service computer further comprises a debug step.

10. The tape-out system of claim 1, wherein the processing step of the design service computer further comprises a file converting step.

11. The tape-out system of claim 1, wherein the processing step of the design service computer further comprises an electronic signature step.

12. A method of a tape-out system of a mask tooling network for multi-users, the steps of the method comprising:
    providing an integrated circuit (IC) designer computer, a design service computer, a mask house computer, wherein the IC designer computer, the design service computer and the mask house computer are linked by a network;

requesting a mask tooling of a product from the IC designer computer, wherein a data of the mask tooling is transmitted to the design service computer;

performing a processing step and a summarizing step with an electronic signature to process the mask tooling data from the design service computer;

transmitting a signal from the design service computer to notify the mask house computer and the IC designer computer to process and summarize the mask tooling data; and transmitting a signal of the electronic signature to the design service computer after the mask house computer and the IC designer computer process the mask tooling data.

13. The method of claim 12, wherein the processing step of the design service computer further comprises; a debug step.

14. The method of claim 12, wherein the processing step of the design service computer further comprises a file converting step.

15. The method of claim 12, wherein the processing step of the design service computer further comprises an electronic signature step.

16. A method of a tape-out system of a mask tooling network for multi-users, the steps of the method comprising:

providing an integrated circuit (IC) designer computer, a design service computer, and a mask house computer, wherein the IC designer computer, the design service computer and the mask house computer are linked by a network;

requesting a device tape-out from the IC designer computer, wherein the request of the device tape-out is transmitted through the network from device design attributions to the design service computer; and performing a processing step with an electronic signature to process the device design attributions by the design service computer, wherein the device design attributions are transmitted to the IC designer computer.

17. The method of claim 16, wherein the IC designer computer varies the device design attributions, which are sent back to the design service computer many times.

18. The method of claim 16, wherein an electronic signature is added after the design service computer summarizes the device design attributions, and a final design data is obtained and transmitted to the IC design computer.

19. The method of claim 16, wherein the processing step of the design service computer further comprises a debug step.

20. The method of claim 16, wherein the processing step of the design service computer further comprises a file convening step.

* * * * *